United States Patent
Chuang et al.

(10) Patent No.: US 7,282,777 B1
(45) Date of Patent: Oct. 16, 2007

(54) INTERBAND CASCADE DETECTORS

(75) Inventors: Shun Lien Chuang, Urbana, IL (US); Jian Li, Pasadena, CA (US); Rui Q. Yang, Valencia, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 11/227,989

(22) Filed: Sep. 15, 2005

Related U.S. Application Data

(60) Provisional application No. 60/613,554, filed on Sep. 27, 2004, provisional application No. 60/655,997, filed on Feb. 24, 2005.

(51) Int. Cl.
*H01L 27/14* (2006.01)
(52) U.S. Cl. ............... 257/431; 977/820; 257/E31.001
(58) Field of Classification Search ............. 257/431; 977/820
See application file for complete search history.

(56) References Cited

U.S. PATENT DOCUMENTS

| | | | |
|---|---|---|---|
| 5,588,015 A | 12/1996 | Yang | 372/45 |
| 6,404,791 B1 | 6/2002 | Yang | 372/45 |
| 6,445,000 B1 * | 9/2002 | Masalkar et al. | 257/21 |
| 6,455,908 B1 | 9/2002 | Johnson et al. | 257/440 |

OTHER PUBLICATIONS

Yang et al., "Interband cascade lasers; progress and challenges", *Physica E 7*, pp. 69-75, 2000.

Hofstetter et al., "Quantum-cascade-laser structures as photodetectors", *Applied Physics Letters*, vol. 81, No. 15, Oct. 2002.
R.Q. Yang, "Mid-infrared interband cascade lasers based on type-II heterostructures", *Microelectronics Journal* 30, pp. 1043-1056, 1999.
Li et al., "Interband cascade detectors with room temperature photovoltaic operation", *Applied Physics Letters 86*, 101102, 2005.
Smith et al., "Proposal for strained type II superlattice infrared detectors", *J. Appl. Phys. 62*, pp. 2545-2548, Sep. 1987.
B.F. Levine, "Quantum-well infrared photodetectors", *J. Appl. Phy. 74*, pp. R1-R81, Oct. 1993.
Chuang et al., "MURI-ARO: Fundamental Research on Infrared Detection", http://web.archive.org/web/20030407025118/optoelectronics.ece.uiuc.edu/research.muri.ar ..., Jun. 23, 2003.

* cited by examiner

*Primary Examiner*—B. William Baumeister
*Assistant Examiner*—Matthew L. Reames
(74) *Attorney, Agent, or Firm*—Bromberg & Sunstein LLP

(57) ABSTRACT

A device for detecting radiation, typically in the infrared. Photons are absorbed in an active region of a semiconductor device such that the absorption induces an interband electronic transition and generates photo-excited charge carriers. The charge carriers are coupled into a carrier transport region having multiple quantum wells and characterized by intersubband relaxation that provides rapid charge carrier collection. The photo-excited carriers are collected from the carrier transport region at a conducting contact region. Another carrier transport region characterized by interband tunneling for multiple stages draws charge carriers from another conducting contact and replenishes the charge carriers to the active region for photo-excitation. A photocurrent is generated between the conducting contacts through the active region of the device.

14 Claims, 4 Drawing Sheets

INTERBAND CASCADE DETECTORS

The present application claims priority from U.S. Provisional Application No. 60/613,554, filed Sep. 27, 2004, and U.S. Provisional Application No. 60/655,997, filed Feb. 24, 2005, both of which applications are incorporated herein by reference.

The invention described herein was made in the performance of work under a NASA contract, and is subject to the provisions of Public Law 96-517 (35 U.S.C. § 202) in which the Contractor has elected to retain title. This invention was developed with Government support under Contract Number DAAD19-01-1-0591 awarded by the United States Army Research Office. The Government has certain rights in the invention.

TECHNICAL FIELD AND BACKGROUND ART

The present invention pertains to methods and apparatus for detecting radiation, and more particularly to detection of photons in a semiconductor structure. The invention is advantageously employed in the detection of electromagnetic radiation, especially infrared and far-infrared radiation.

Currently, prevalent infrared photodetection technology is based on interband absorption in bulk mecury-cadmium-telluride (HgCdTe, MCT) typically operating at cryogenic temperatures and thereby imposing attendant cost and size requirements. Moreover, material homogeneity constraints limit the applicability of MCT in the context of fabricating large focal plane array devices.

Infrared detectors based on type-II superlattice structures engineered by deposition of a stack of successive semiconductor layers have shown promise for thermal imaging applications because of possible suppression of dark currents and Auger recombination. Superlattice detectors, based on optical transitions between respective electron and hole minibands in type-II superlattices of alternating III-V compounds, are theoretically superior to MCT at wavelengths long ward of 12 micrometers. Superlattice detectors, are described by Smith et al., *Proposal for Strained Type II Superlattice Infrared Detectors*, J. Appl. Phys., vol. 62, pp. 2545-48 (1987), which is incorporated herein by reference. Like MCT photodiodes, superlattice detectors are also typically limited to cryogenic operation.

Quantum well intersubband photodetectors (QWIPs) are based on absorption between subbands as a photodetection mechanism rather than absorption between the valence and conduction bands. Due to quantum selection rules, intersubband transitions cannot be photo-excited by normal-incidence radiation (i.e., radiation polarized in the plane of the absorption layer), so grating structure is often introduced for normal incidence detection, adding cost and complication of fabrication to the device structure. QWIPs are reviewed in detail in Levine, *Quantum-Well Infrared Photodetectors*, J. Appl. Phys., pp. R1-R81 (1993), incorporated herein by reference.

Photodetectors based on type-I intersubband quantum cascade laser (QCL) structures have also been demonstrated, as described, for example, in Hofstetter et al., *Quantum-Cascade-Laser Structures as Photodetectors*, Appl. Phys. Lett., vol. 81, pp. 2683-85 (2002), incorporated herein by reference. Like QWIPs, these detectors are also based on intersubband photo-excitation, and therefore, as in the case of QWIPs, quantum selection rules preclude their application to normal incidence radiation.

Various applications, particularly in the field of line-of-sight communications and thermal imaging, make high-bandwidth detection of normal-incidence infrared radiation very desirable, especially if room-temperature photovoltaic operation is achieved.

SUMMARY OF THE INVENTION

In accordance with preferred embodiments of the present invention, detection of electromagnetic radiation is provided by a. absorbing photons in an active region of a semiconductor device, the active region having one or a plurality of photo-absorptive layers and thereby inducing an interband optical transition and generating photo-excited charge carriers;

b. coupling the photo-excited electrons into a carrier transport region characterized by fast electronic processes such as intersubband relaxation;

c. collecting photo-excited carriers from the carrier transport region at a conducting contact region; and d. generating a photocurrent between one conducting contact, through the active region of the device, and the other conducting contact.

In various other embodiments of the invention, the semiconductor device may be maintained substantially at room temperature and may be operated in a photovoltaic mode. Alternatively, a bias potential may be applied across the semiconductor device and the device may be operated in a cooled environment to enhance performance.

In accordance with a further aspect of the present invention, a radiation detector is provided that has at least one detector stage. Each detector stage has an active region having a plurality of interband absorptive layers (characterized by either a type-I or type-II quantum-well structure). Each detector stage also has a carrier transport and relaxation region coupled to the active region. The radiation detector has an electrical contact structure for coupling an external circuit to the active region and the carrier transport and relaxation region. The quantum well layers may include III-V compounds such as antimony compounds.

In accordance with various embodiments of the invention, photon absorption may be either of photons at normal incidence to a surface of the active region or by an edge-coupled waveguide. The device may comprise a portion of a focal plane array of active regions, and the semiconductor device may also be embedded in an optical cavity for enhancing infrared absorption.

BRIEF DESCRIPTION OF THE DRAWINGS

The foregoing features of the invention will be more readily understood by reference to the following detailed description, taken with reference to the accompanying drawings, in which.

DETAILED DESCRIPTION OF SPECIFIC EMBODIMENTS

Interband cascade detectors (ICDs) provided in accordance with preferred embodiments of the present invention have three salient features. The first feature is an active region, in which photon absorption results in photoexcitation by interband transition from the valence to conduction band. The second feature is a carrier collection region where intraband processes occur at a rate typically far exceeding that of the interband transition. The third feature, in the case where more than one cascade stage is provided, is a carrier replenish region where interband tunneling recombination processes occur at a rate typically far exceeding that of the interband transition.

Exemplary embodiments of the present invention are discussed in a paper entitled *Interband Cascade Detectors with Room Temperature Photovoltaic Operation*, which is appended hereto and incorporated herein by reference.

The ICD may have one or more stages, each stage having an active region where photons are absorbed and charge carriers created, a multiple-QW region forming an energy ladder enabling efficient transport of electrons via intraband (or so-called intersubband) relaxation after photon excitations, and a carrier transport region enabling efficient replenishment of carriers into the active region. Operation of a multiple-stage device is described with reference to FIG. 1, which is a schematic depiction of the operation of an ICD in accordance with the present invention.

Figure 1:
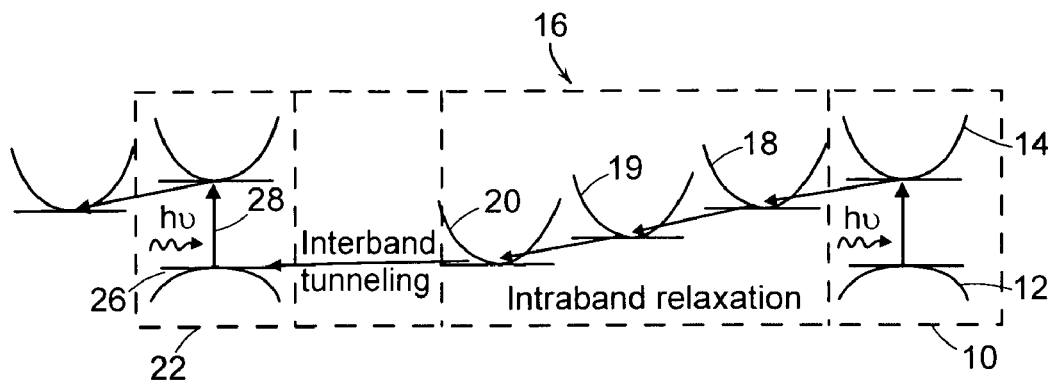
FIG. 1 is a schematic depiction of the operation of an interband cascade detector (ICD) in accordance with preferred embodiments of the present invention.

In FIG. 1, in which energy is plotted in the vertical direction, a photon, designated by its energy hv, is absorbed in a first active region 10, characterized by a valence band 12 and a conduction band 14. Absorption layers of active region 10 are comprised of binary (InAs, AlSb, GaSb), ternary ($Ga_xIn_{1-x}Sb$, AlInSb, InAsSb), and quaternary (InAlGaSb) compound semiconductors, where the compounds in parentheses are provided solely as examples, though other compounds, such as other III-V compounds, are within the scope of the invention as described herein and as claimed in any appended claims. Insofar as the superlattice is of type-II, the band alignment may be indirect in real space, indeed, the conduction band of one component (InAs) may have a lower energy than the valence band of another (GaSb), thereby advantageously providing a small band gap that may be smaller than that of either of the constituent layer materials. Thus, interband photoexcitation by long-wavelength photons can be achieved. Indeed, the cutoff wavelength of these devices can be tailored, by adjusting the active region quantum structure, to cover the entire mid- to far-infrared spectral range.

The next region to the left of absorption region 10 in FIG. 1 is an intraband relaxation region 16 comprised of multiple quantum well (QW) layers of such binary, ternary, or quaternary III-V compounds, for example, as those discussed above with respect to the active region.

Multiple QW region 16 is designed to provide an energy ladder of subbands 18, 19, 20, enabling fast and efficient transport of electrons that have been photo-excited in the active region. More particularly, the energy ladder is formed in the region, with multiple energy levels 18, 19, 20, having energy separations typically close to or somewhat larger than an optical phonon energy $hv_{op}$ (~30 meV in InAs), however all ranges of energy separation among the energy sublevels are within the scope of the present invention as described herein.

Barrier layers in the multiple QW region 16 are thin enough to allow significant wavefunction overlaps between adjacent quantum wells in the energy ladder similar to that of type-I QC structures, enabling fast and efficient transport of electrons via intraband (or so-called intersubband) relaxation after photon excitations.

The intraband (or intersubband) relaxation typically occurs on a time scale (~picoseconds) that is much shorter than the time scale (~nanoseconds) for interband recombination in active region 10. Thus extremely high-speed (broadband, on the order of many GHz) operation of the ICD may advantageously be achieved.

As described, multiple stages of active region/relaxation region zones may be provided, with a second active region 22 shown to the far left in FIG. 1. Through interband tunneling 24 facilitated by the broken-gap band alignment in a type-II QW structure, electrons are transferred to valence band 26 of the succeeding active region 22, where further absorption can take place. This mechanism enables quick and efficient removal of holes after photo-excitation. The combined effect of efficient collection of both photo-excited electrons and holes translates to high quantum efficiency for each cascade stage, ultimately contributing to high responsivity. As the successive periods are connected in series, a current loop is provided for flow of photocurrent through the entire device, and external bias is not required, such that the ICD may advantageously operate in a photovoltaic mode.

It is to be understood that the scope of the invention is not limited to the discretely (digital-) graded band gaps discussed herein nor to operation in a photovoltaic mode, and it is further to be understood that the invention also encompasses continuously graded band-gap layers or the application of a bias potential such that long-wavelength infrared detection may be achieved in accordance with particular embodiments of the invention.

Figure 2:
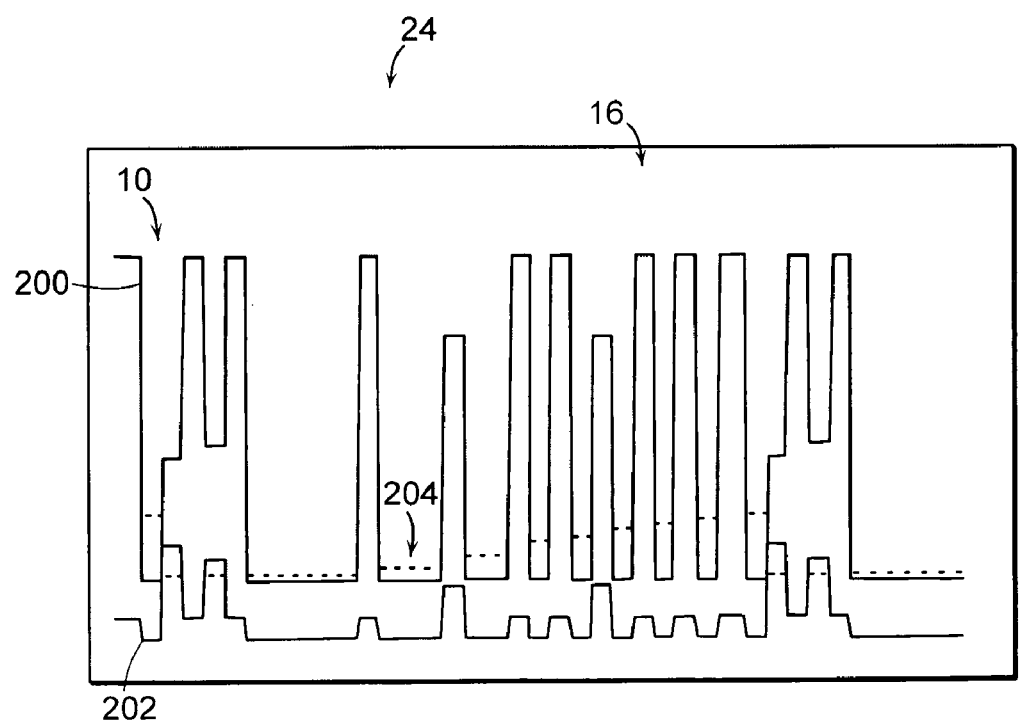
FIG. 2 shows the band edge alignment of one period of the ICD structure under zero bias for photovoltaic detection, in accordance with an exemplary embodiment of present invention.

Referring now to FIG. 2, the band edge alignment is shown for an exemplary interband cascade (IC) structure, operated in an unbiased photovoltaic mode, in accordance with one embodiment of the present invention. The top solid lines 200 plot the energy of the conduction band edge of the ICD structure while the bottom solid lines 202 are the valence band edge. Dashed lines 204 are the quantized subband energy levels in each layer and those on the conduction band form an energy ladder for carrier relaxation from right to the left of the diagram. Absorption region 10, carrier tunneling and recombination region 24, and intersubband carrier relaxation region 16 are denoted in correspondence with the schematic depiction of FIG. 1. Successive layers are comprised of AlSb, GaInSb, InAs, AlInSb, deposited in thicknesses proportional to the horizontal width shown for each layer.

Figure 3:
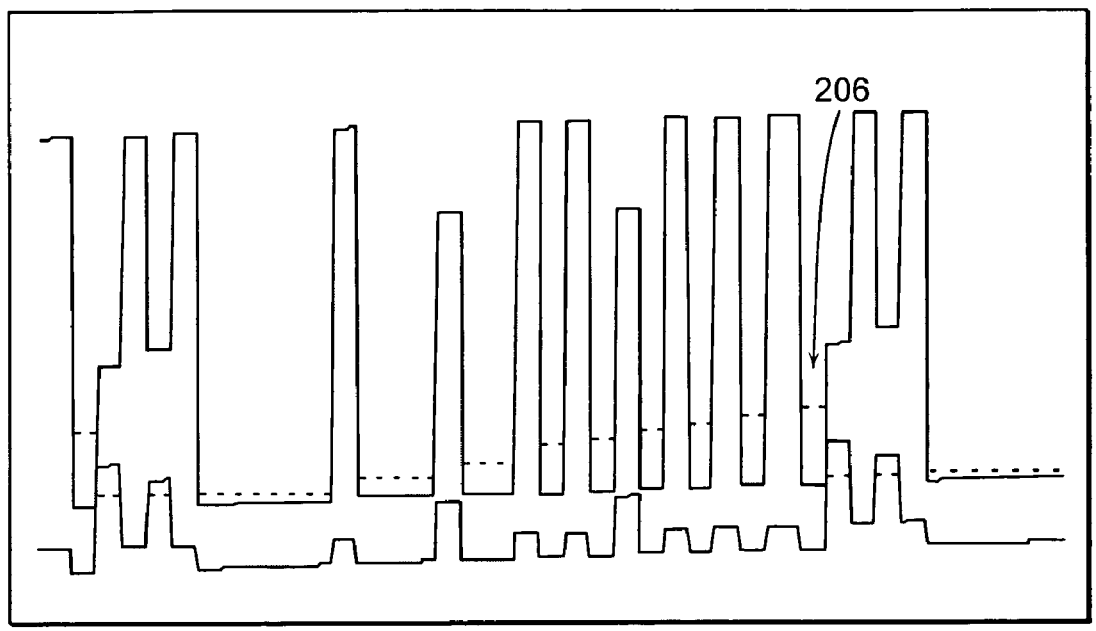
FIG. 3 shows the band edge alignment of one period of the ICD structure of FIG. 2 under reverse bias for photovoltaic detection, in accordance with an exemplary embodiment of present invention.

Under reverse bias for photovoltaic detection, the band edge alignment for the structure of FIG. 2 is modified as shown in FIG. 3. Band bending due to the reverse bias raises the subband edges 206 slightly higher on the right, as a function of the applied reverse bias.

Figure 4:
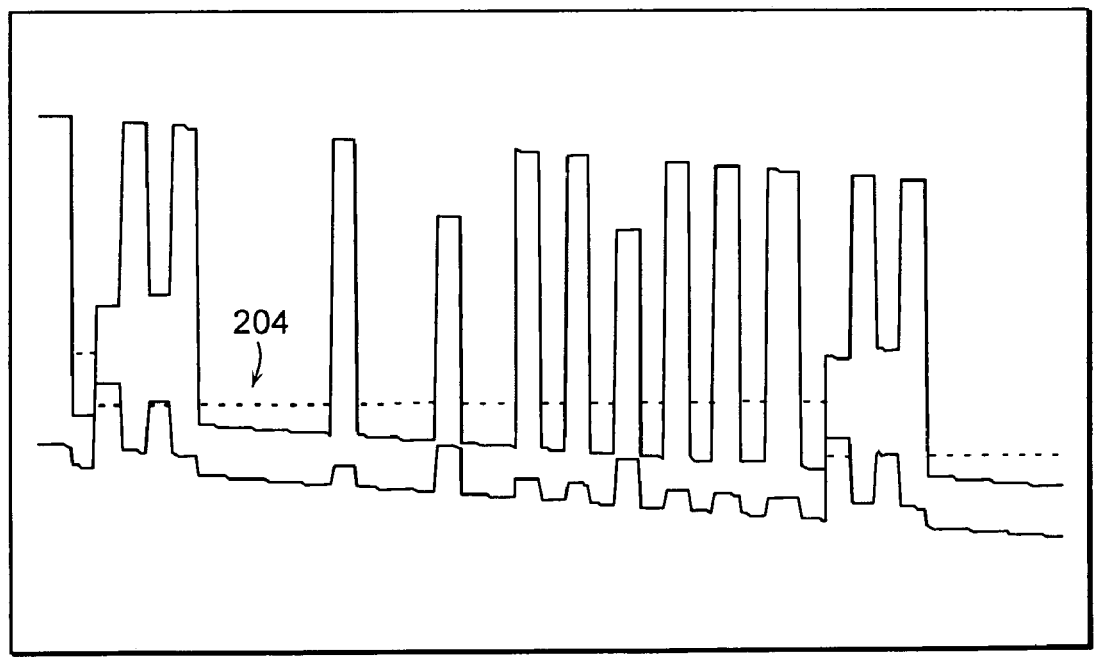
FIG. 4 shows the band edge alignment of one period of the ICD structure of FIG. 2 under forward bias as for laser operation, in accordance with an exemplary embodiment of present invention.

The band edge alignment of one period of the ICD structure under forward bias is shown in FIG. 4. Such a bias configuration may be employed for laser operation of the structure, and the subband edges 204 are aligned for carrier transport from the left type-II QW active layers toward the right.

Due to the photovoltaic nature of the detector operation enabled by the present invention, the ICD may operate limited only by Johnson noise, $i_n^2 = 4kT/R_0$, per unit bandwidth, where k is the Boltzmann constant, T is temperature, and $R_0$ is the differential resistance. The Johnson noise in the devices fabricated in accordance with the invention is, itself, very low due to the large differential resistance (typically $10^4$-$10^5$ Ω) of the devices of typical area (100,000 μm²).

Figure 5:
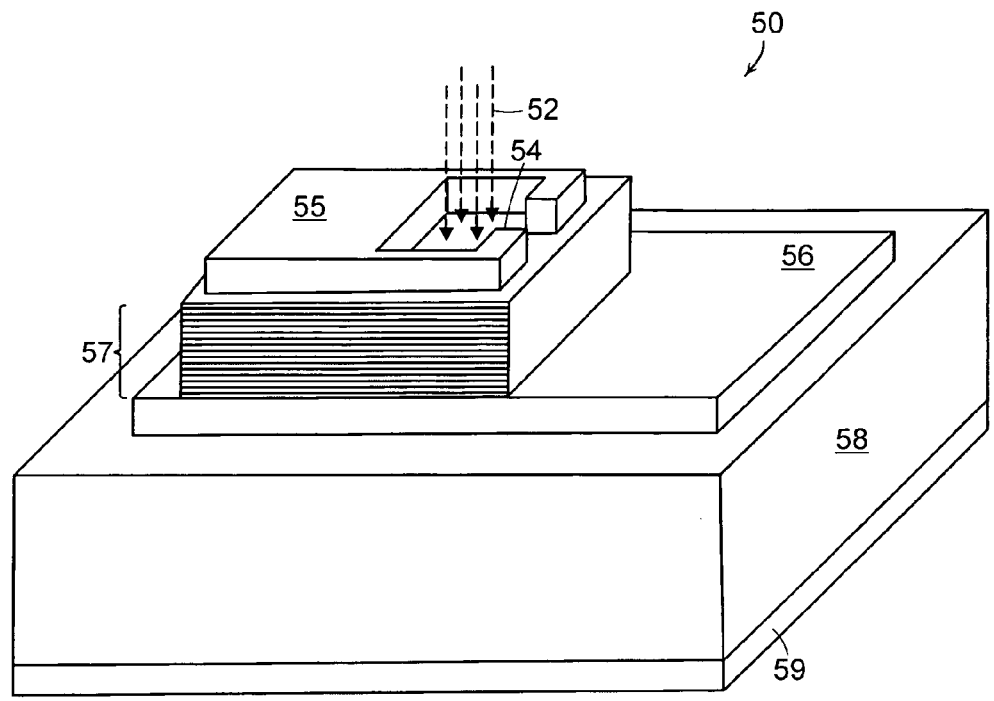
FIG. 5 is a perspective view of a mesa structure embodiment of the present invention for normal surface detection of radiation.

An embodiment of the invention fabricated as a mesa geometry photodetector 50 is shown in FIG. 5. Since photo-excitation of the active region of the detector is by interband absorption, selection rules allow absorption of radiation 52 normally incident on surface 54 of the active region. The cascade structure 57 is grown on substrate 58, here, for example, GaSb, followed by etching to form mesas. A contact metal 56 is deposited on top of the GaSb substrate and the second conducting metal contact 55 is deposited on the top of the mesa using photolithography for contact metal area definition. It should be noted that variations of the geometry are possible; for example, conducting contact 56 may be applied to bottom surface 59 of the substrate wafer. The mesa geometry lends itself advantageously to the fabrication of focal plane arrays, for infrared imaging applications. Moreover, photodetector 50 may be embedded in an optical cavity (such as a Fabry-Perot cavity) either to tailor the spectral response, for narrow-band filtering, for example, or for enhancing infrared absorption generally or with respect to desired spectral characteristics, as known to persons skilled in the optical arts.

Figure 6:
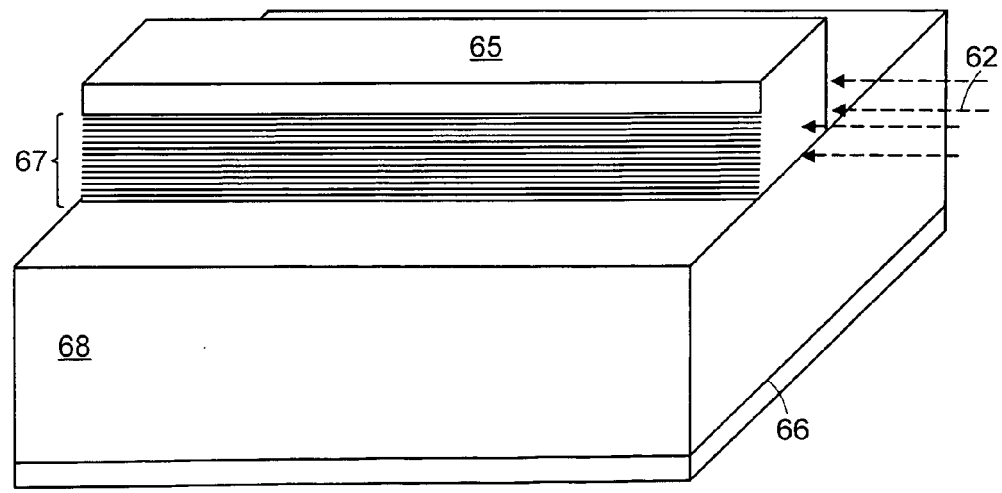
FIG. 6 is a perspective view of an embodiment of the present invention in a waveguide geometry.

An embodiment of the invention fabricated as a waveguide photodetector 60 is shown in FIG. 6. In this configuration, infrared radiation 62 is incident from the side and guided, by virtue of the waveguide structure consisting of the quantum cascade structure 67, as grown on substrate 68. Conducting contacts 65 and 66 are shown, though, as in the case of the mesa geometry, contact 66 may be applied to the upper side of the substrate.

Figure 7:
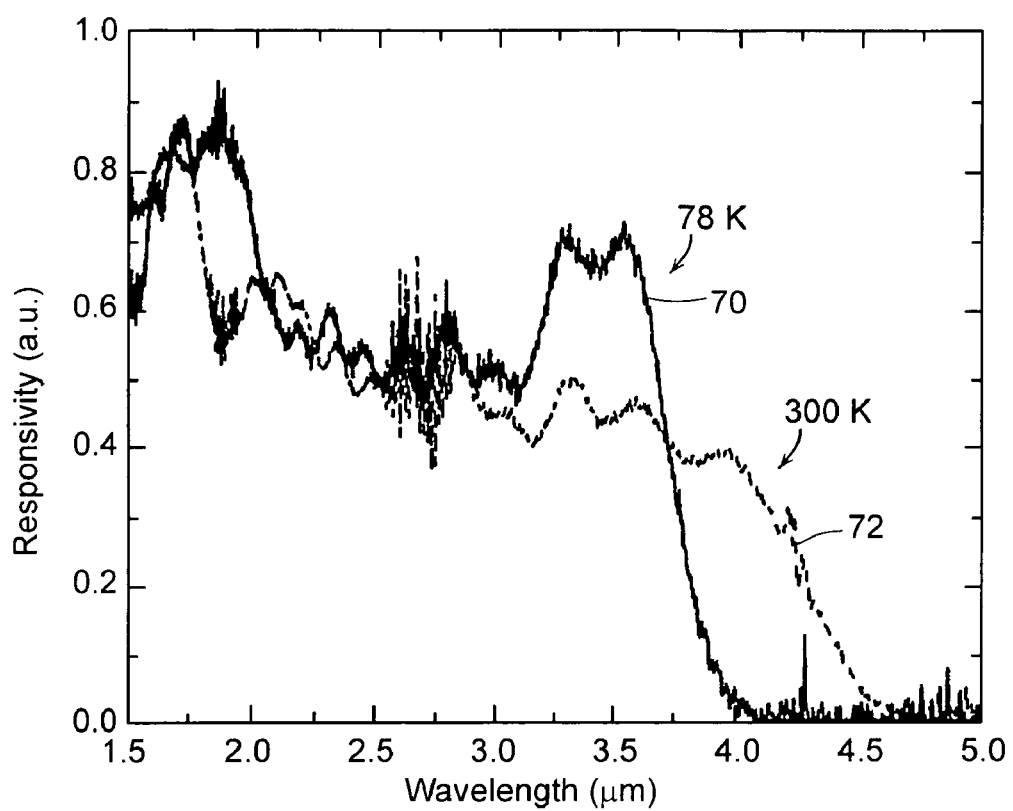
FIG. 7 shows typical photovoltaic spectral response of a device in accordance with an embodiment of the present invention to normal-incidence radiation at room temperature and 78 K.

FIG. 7 depicts the photovoltaic responsivity (at zero bias) to infrared radiation at normal incidence of a device in accordance with one of the embodiments of the present invention. The curve marked 70 indicates responsivity at 78 K, while the curve marked 72 indicates responsivity at room temperature (300 K). A peak responsivity obtained in operation of such a device is 46 mA/W at a wavelength of 3 μm, which corresponds to $D^* = 1.4 \times 10^9$ cm $Hz^{1/2}$/W, a high value comparable to that of the commercially available PbSe photoconductive detectors operating in a similar infrared wavelength range at room temperature.

The embodiments of the invention heretofore described are intended to be merely exemplary and numerous variations and modifications will be apparent to those skilled in the art. In particular, while the invention has been described in the context of infrared photon detection, it is to be understood that the invention may advantageously be applied to the detection of other radiation exciting charge carriers in the semiconductor structure as described. All such variations and modifications are intended to be within the scope of the present invention as defined in any appended claims.

What is claimed is:

1. A method for detecting electromagnetic radiation, the method comprising:
   a. absorbing photons in an active region of a semiconductor device, the active region having a plurality of photo-absorptive type-II quantum well layers and thereby inducing an interband electronic transition and generating photo-excited charge carriers or electron-hole pairs;
   b. coupling the photo-excited charge carriers into at least one carrier transport region-characterized by carrier relaxation, transport, and tunneling processes significantly faster than recombination processes in the active region;
   c. collecting photo-excited carriers from the carrier transport region at a conducting contact region; and
   d. generating a photocurrent between the conducting contact regions through the active region of the device, the photocurrent characterizing the number of photons absorbed in the interband electronic transition.

2. A method in accordance with claim 1, wherein the photons are characterized by a wavelength in the infrared.

3. A method in accordance with claim 1, further comprising the step of maintaining the semiconductor device substantially at room temperature.

4. A method in accordance with claim 1, further comprising the step of cooling the semiconductor device to an operating temperature below room temperature.

5. A method in accordance with claim 1, further comprising the step of operating the semiconductor device in a photovoltaic mode or zero bias voltage.

6. A method in accordance with claim 1, further comprising the step of applying a bias potential across the semiconductor device.

7. A method in accordance with claim 1, wherein the step of absorbing photons includes absorbing photons at normal incidence to a surface of the active region.

8. A method in accordance with claim 1, wherein the step of absorbing photons includes absorbing photons coupled to the active region by an edge-coupled waveguide.

9. A method in accordance with claim 1, further comprising imaging in a focal plane array of active regions.

10. A method in accordance with claim 1, further comprising embedding the semiconductor device in an optical cavity for enhancing infrared absorption.

11. A radiation detector comprising:
   a. at least one detector stage, each detector stage comprising:
      i. an active region having a plurality of photo-absorptive layers, the active region characterized by a structure enabling interband optical transition;
      ii. a carrier transport and relaxation region coupled to the active region and containing multiple type-II quantum wells;
   b. an electrical contact structure for coupling an external circuit to one active region and one carrier transport and relaxation region; and
   c. a current loop for continuous flow of photocurrent through the device and the external circuit upon absorption of photons in the active region.

12. A radiation detector in accordance with claim 11, wherein the quantum well layers include III-V compounds.

13. A radiation detector in accordance with claim 12, wherein the quantum well layers include antimony compounds.

14. A radiation detector in accordance with claim 12, wherein the quantum well layers are chosen from the group of binary, ternary, and quaternary III-V compounds.

* * * * *

UNITED STATES PATENT AND TRADEMARK OFFICE
CERTIFICATE OF CORRECTION

PATENT NO. : 7,282,777 B1
APPLICATION NO. : 11/227989
DATED : October 16, 2007
INVENTOR(S) : Shun Lien Chuang et al.

It is certified that error appears in the above-identified patent and that said Letters Patent is hereby corrected as shown below:

On title page, item 73 Assignee,
replace "California Institute of Technology"
with "The Board of Trustees of the University of Illinois and California Institute of Technology"

Signed and Sealed this

Twenty-third Day of December, 2008

JON W. DUDAS
*Director of the United States Patent and Trademark Office*